(12) United States Patent
Krippner et al.

(10) Patent No.: US 8,726,741 B2
(45) Date of Patent: May 20, 2014

(54) SET OF MULTIAXIAL FORCE AND TORQUE SENSOR AND ASSEMBLING METHOD

(75) Inventors: Peter Krippner, Karlsruhe (DE); Paul Szasz, Plankstadt (DE); Manfred Wetzko, Schriesheim (DE); Torgny Brogardh, Västerås (SE)

(73) Assignee: ABB AG, Mannheim (DE)

( * ) Notice: Subject to any disclaimer, the term of this patent is extended or adjusted under 35 U.S.C. 154(b) by 184 days.

(21) Appl. No.: 13/204,129

(22) Filed: Aug. 5, 2011

(65) Prior Publication Data
US 2011/0314935 A1    Dec. 29, 2011

Related U.S. Application Data

(63) Continuation of application No. PCT/EP2009/000811, filed on Feb. 6, 2009.

(51) Int. Cl.
*G01L 5/10* (2006.01)
*G01L 1/04* (2006.01)

(52) U.S. Cl.
USPC .............................. 73/862.045; 73/862.041

(58) Field of Classification Search
USPC ..................... 73/862.045, 862.041
See application file for complete search history.

(56) References Cited

U.S. PATENT DOCUMENTS

| | | | | |
|---|---|---|---|---|
| 5,872,320 | A * | 2/1999 | Kamentser et al. | 73/862.044 |
| 6,675,663 | B1 * | 1/2004 | Irion et al. | 73/862.627 |
| 6,909,354 | B2 * | 6/2005 | Baker et al. | 338/47 |
| 7,533,557 | B1 * | 5/2009 | Mott et al. | 73/12.14 |
| 2009/0158860 | A1 * | 6/2009 | Lee et al. | 73/862.045 |
| 2012/0234104 | A1 * | 9/2012 | Seibold | 73/862.045 |

FOREIGN PATENT DOCUMENTS

| | | |
|---|---|---|
| EP | 0 282 304 A2 | 9/1988 |
| WO | WO 99/04235 A1 | 1/1999 |
| WO | WO 02/063261 A | 8/2002 |

OTHER PUBLICATIONS

International Search Report (PCT/ISA/210) issued on Sep. 9, 2009, by European Patent Office as the International Searching Authority for International Application No. PCT/EP2009/000811.

* cited by examiner

*Primary Examiner* — Lisa Caputo
*Assistant Examiner* — Jamel Williams
(74) *Attorney, Agent, or Firm* — Buchanan Ingersoll & Rooney PC

(57) ABSTRACT

A multiaxial force/torque sensor assembly and method for assembling such a sensor assembly are disclosed. The sensor assembly includes a set of at least two sensors each being made of strain gauges, which are each arranged at a definite angle and distance relative to each other and which are each fixed to a transducer body, which is mechanical contact with a printed circuit board. The printed circuit board includes clearances for each strain gauge as well as associated electronic components and wiring located on the remaining area of the printed circuit board which will monitor compressive and tensile stresses in the measurement directions of the sensors. The method includes positioning the strain gauges on the plane measurement surface of a transducer body in a definite arrangement; fixing the strain gauges to the transducer body by means of adhesives, and connecting the strain gauges to respective conductors by means of electrically bonding.

40 Claims, 6 Drawing Sheets

10A        10B

SET OF MULTIAXIAL FORCE AND TORQUE SENSOR AND ASSEMBLING METHOD

RELATED APPLICATION

This application claims priority as a continuation application under 35 U.S.C. §120 to PCT/EP 2009/000811 filed as an International Application on Feb. 6, 2009 designating the U.S., the entire content of which is hereby incorporated by reference in its entirety.

FIELD

The present disclosure relates to a set of multiaxial force and torque sensors, and to a method of assembling such sensors. More particularly, the present disclosure relates to multiaxial force sensors made with strain gauges, and to a method of assembling such sensors.

BACKGROUND INFORMATION

Force and torque sensors having six degrees of freedom (6 DOF) are used for robot control in most applications involving an interaction between a tool and a work object. Applications of such tools can include assembling, grinding, deburring, drilling, milling, machine tending, laser welding, sheet bending, mechanical testing, etc.

Moreover, in many cases, the designing of programs for such applications is difficult using known methods even though 6 DOF force/torque sensors are used to make direct interaction between human beings and robots possible during calibration, programming and program editing.

Accordingly, known techniques do not provide a means to develop, manufacture and assemble a 6 DOF force/torque sensor efficiently and cost-effectively.

WO 9904235 A discloses a load cell body for transmitting forces and moments in plural directions. The load cell body includes an integral assembly having: a rigid central hub; a rigid annular ring concentric with the central hub; at least three radial tubes extending radially along corresponding longitudinal axes from the central hub to the annular ring; and a flexure member extending between an end of each radial tube to the annular ring. The flexure member is compliant for displacements of each corresponding radial tube along the corresponding longitudinal axis.

This known multiaxial force sensor is highly accurate, but it needs a large amount of handwork in manufacturing. This causes high cost and limits the achievable production volume.

The application of strain gauges via adhesive bonding needs much care, as they have to be applied to varying sides of complex 3-dimensional metal structures. The precision of the resulting measurement depends considerably on the accurate orientation of the strain gauges, and even with mounting aids, the handmade assembly is a slow and moderately precise process causing significant efforts.

Based on this state of the art it is an object of the disclosure to provide for multiaxial force and/or torque sensors in a definite arrangement in particular for use for robot control and a method for assembling the respective sensors which is less expensive than with the state of the art, since multiaxial force-torque sensors made with state-of-the art strain gauge technology are high-precision, but complex and very expensive products since the typical design requires a large amount of handwork in production.

SUMMARY

An exemplary embodiment of the present disclosure provides a multiaxial force/torque sensor assembly. The exemplary sensor assembly includes a printed circuit board, and a transducer body in mechanical contact with the printed circuit board. The exemplary sensor assembly also includes a set of at least two sensors each being made of strain gauges, which are each arranged at a definite angle and distance relative to each other and which are each fixed to the transducer body. The printed circuit board includes clearances for each strain gauge, respectively, and associated electronic components and wiring located on a remaining area of the printed circuit board for monitoring compressive and tensile stresses in measurement directions of the sensors.

An exemplary embodiment of the present disclosure provides a method for assembling a multiaxial force/torque sensor assembly including a set of at least two sensors each being made of strain gauges. The exemplary method includes arranging each of the strain gauges on a plane measurement surface of a transducer body in a definite arrangement so that each of the strain gauges are arranged at a definite angle and distance relative to each other. The exemplary method also includes fixing each of the strain gauges to the transducer body via adhesives, and connecting the gauges to respective conductors by electrical bonding.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
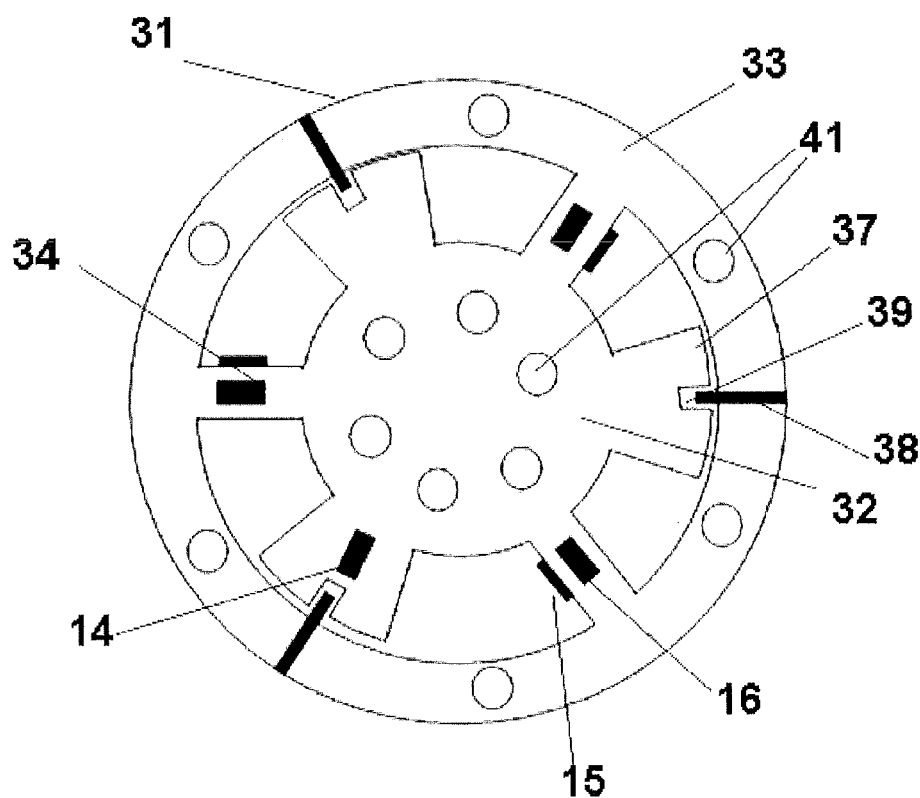
FIG. 1 is a schematic diagram of a known 6-axis force-torque sensor.

An exemplary embodiment of the present disclosure provides a multiaxial force/torque sensor assembly which includes a set of at least two force sensors each being made of strain gauges. Each of the strain gauges are arranged at a definite angle relative to each other and are each being fixed to a transducer body, which can be a metal plate, for example, and which is laminated with a printed circuit board (PCB). The printed circuit board includes clearances for each strain gauge with associated electronic components and wiring located on the remaining area of the printed circuit board, which, when the transducer body is applied to a structural element, will monitor compressive and tensile stresses in those axes corresponding to the angles of the sensors.

According to an exemplary embodiment of the present disclosure, the printed circuit board can be made of a flexible material. With such a flexible printed circuit board, it is possible to join several transducer modules. Such a flexible joining allows (i) an application of all strain gauges in one plane, and (ii) the transducer modules can be positioned arbitrarily in space, having all relevant connections already installed.

In other words, one can bend the flexible printed circuit board (PCB) according to the form and configuration of the work piece to be monitored.

Accordingly, the exemplary sensor assembly according to the present disclosure can be implemented, for example, when the strain gauges are joined to a flexible printed circuit board. The sensor modules are glued to a transducer (elastic metallic body, for example, a slim bar, cantilever, membrane, etc.) and contacted to the printed circuit board which will be bent for use arbitrarily in space.

In accordance with an exemplary embodiment of the present disclosure, the alignment of the clearances in the printed circuit board corresponds to the planned alignment of the strain gauges.

An exemplary embodiment of the present disclosure provides that the joints of the strain gauges to the transducer and the printed circuit board are made by bonding. For example, the strain gauges can be bonded with adhesives or low temperature melting glasses to the transducer and electrically bonded (e.g., by means of ultrasonic- or thermo-compression bonding) to the conductors on the printed circuit board. Bonding the thin bond wires provides a good decoupling of the strain gauge from the structure of the printed circuit board. Alternatively, the strain gauge bond wires can also be contacted to the PCB by electrically conductive adhesives to reduce the thermo-mechanical load of the process.

In accordance with an exemplary embodiment, the sensor assembly can include at least one semiconductor strain gauges to improve the quality of measurement as well as the long time drift stability of such sensors.

According to an exemplary embodiment of the present disclosure, the sensor assembly is protected from environmental influences by a protective coating which covers the strain gauges as well as the electrical contacts.

In accordance with an exemplary embodiment of the present disclosure, acceleration sensors may be applied to the printed circuit board, in addition to strain and torque sensors.

In accordance with an exemplary embodiment of the present disclosure, the sensor assembly can include strain gauges which are arranged in a Wheatstone Circuit, which is prefabricated on the printed circuit board.

In accordance with an exemplary embodiment, the sensor assembly can include a combination of at least three sets of strain gauges arranged at different angles with respect to each other, in order to enable the sensor assembly to perform complex measurements of stresses and torques in six degrees of freedom.

In accordance with an exemplary embodiment, the transducer body can be provided with a ring structure which includes two concentric rings and at least three beams (e.g., six beams being arranged in a plane hexapod structure), where the strain gauges are fixed to each end of the beams and to the ring at the respective joint position of each beam with the rings.

In accordance with an exemplary embodiment of the present disclosure, the sensor assembly can be provided with a transducer body which has a spoke wheel structure, and the strain gauges are fixed to the wheel as well as to the spoke-arms.

Exemplary embodiments of the present disclosure also provide a method for assembling such sensor assemblies causing less efforts combined with at least the same quality and reliability of such assemblies as compared to known techniques.

In accordance with an exemplary embodiment, a method is provided for assembling a multiaxial force/torque sensor assembly according to the aforementioned sensor assemblies, where the sensors are each made of strain gauges. The exemplary method can include the steps of: (i) providing a preferably metallic transducer structure (e.g., a metallic transducer structure), which is either monolithic or modular, positioned with all surfaces for strain gauge application in one plane; (ii) applying a prefabricated PCB (printed circuit board) to an application surface of the transducer; (iii) positioning the strain gauges on the plane measurement surface of at least one transducer body (bodies) in a definite arrangement according to the clearances in the PCB (this step can optionally include the positioning of any other electrical component on the PCB, for example, by using a pick-and-place machine); (iv) fixing the strain gauges to the transducer by means of adhesives and/or low melting glasses; (v) connecting the strain gauges to the PCB using thin, flexible bond wires by means of electrically bonding, soldering and/or electrically conductive adhesives; (vi) and arranging, in case of modular transducer (several components), the transducer parts in space to achieve an orientation of the strain gauges which allows measurement of different degrees of freedom.

In order to overcome the impreciseness with known techniques when mounting the strain gauges (e.g., semiconductor strain gauges) on the transducer respectively connecting them with the printed circuit board, the exemplary method of the present disclosure for assembling a sensor assembly can include positioning the strain gauges in their designed position in the clearances of the PCB by a pick-and-place machine.

According to an exemplary embodiment of the present disclosure, the printed circuit board is provided for receiving the electrical contacting of the strain gauges. For example, the electrical contacting of the strain gauges can be performed by wire bonding (e.g., ultrasonic- or thermo-compression bonding). The thin bond wires provide a good decoupling of the strain gauge from the printed circuit board structure. Alternatively, the strain gauges can also be contacted by electrically conductive adhesives.

According to an exemplary embodiment of the present disclosure, the method for assembling a sensor assembly involves a flexible printed circuit board which is applied to more than one transducer body. In a first step, all strain gauges are applied to in one plane, and in a second step, the transducer bodies are subsequently positioned arbitrarily in space having all relevant connections already installed, and the flexible printed circuit board follows the course of the different planes by bending.

In accordance with an exemplary embodiment of the present disclosure, the method includes, during the process of mounting the strain gauges, all other electric and/or electronic components of the sensor can also be mounted as well.

FIG. 1 shows a known 6 DOF force/torque sensor product 30. The outer ring 33 and inner ring 32 are connected with only three beams 34, and each beam 34 is furnished with two strain gauges 15, 16, which are fixed to the sides of the beams 34. In particular, one strain gauge 16 is fixed to the top side of the beam 34, and one strain gauge 15 is fixed to a lateral side of the respective beam 34. In this transducer design, at least three of the strain gauges 15 must be mounted on the side of the beams 34.

For completeness, the sensor design shown in FIG. 1 also contains one reference strain gauge 14, three overload protection 38 pins, three load pieces 37 with clearances 39 for the overload protection pins 38, and a number of mounting holes 41.

This transducer structure has the disadvantage that it will not be possible to mount all the strain gauges in one plane and that at least two sides of the beams must be machined with high quality, all causing high cost.

Figure 2:
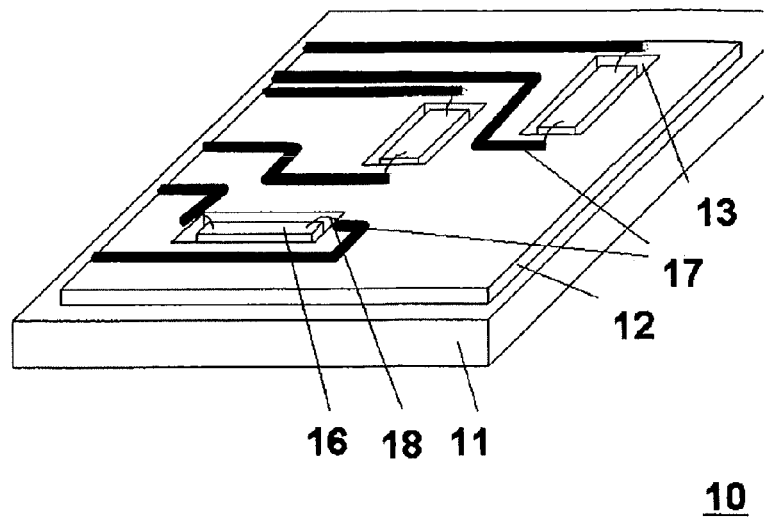
FIG. 2 is a schematic diagram illustrating a principle of a transducer equipped with a printed circuit board with clearances and conductors and with an assembly of strain gauges, according to an exemplary embodiment of the present disclosure.

FIG. 2 shows a schematic diagram of a principle of a transducer body 10 according to an exemplary embodiment of the present disclosure. The transducer body 10 is laminated with a printed circuit board 12 furnished with clearances 13 at certain positions for strain gauges 16 being connected to the printed circuit board 12 by pigtail connectors 18. Conductors 17 are prefabricated on the printed circuit board 12, enabling the connection of the strain gauges 16 with the electronics (e.g., connection to a Wheatstone-bridge).

As shown in FIG. 2, the printed circuit board 12 is mounted on the measurement surface of the transducer body 11, for example, by lamination. In accordance with an exemplary embodiment, the transducer body 11 can be made of mostly steel or aluminum.

The clearances 13 are respectively located exactly at the positions where the strain gauges 16 are to be mounted on the transducer body 11. By means of a pick-and-place machine, for example, the strain gauges 16 can be handled very carefully and precisely by the machine. The strain gauges 16, which can be semiconductor strain gauges, for example, are picked and placed directly and accurately in their designed position within the clearances 13.

In accordance with an exemplary embodiment, at or near the same time when the strain gauges 16 are positioned in the printed circuit board 12, the strain gauges 16 are adhesively bonded to the transducer 11 and electrically bonded, for example, by ultrasonic bonding or thermo-compression bonding, to the pigtail conductors 18 on the printed circuit board 12. The thin bond wires provide a good decoupling of the strain gauges 16 from the structure of the printed circuit board 12.

Alternatively or in addition, the strain gauges 16 and their respective pigtails 18 can also be joined to the printed circuit board 12 by electrically conductive adhesives which means less thermal load for the parts.

In accordance with an exemplary embodiment, appropriate position markers, such as laser marks on the transducer body 11 or the printed circuit board 12, for example, which are recognized by the control of the pick-and-place machine, can be utilized to provide accurate positioning of the strain gauges 16 on the printed circuit board 12.

FIG. 3A shows a side elevation of a single strain gauge 16 with pigtail connectors 18, serving as an instruction explanation for producing a 6 DOF input device. In order to obtain a well-defined pressure on the strain gauge 16 during gluing, the arrangement according to FIG. 3B can be used.

The wiring 18 of the strain gauge 16 is bent to make it possible for the strain gauge 16 to easily move in relation to clearances 13 in the printed circuit board 12, as shown in FIG. 3B.

Figure 3:
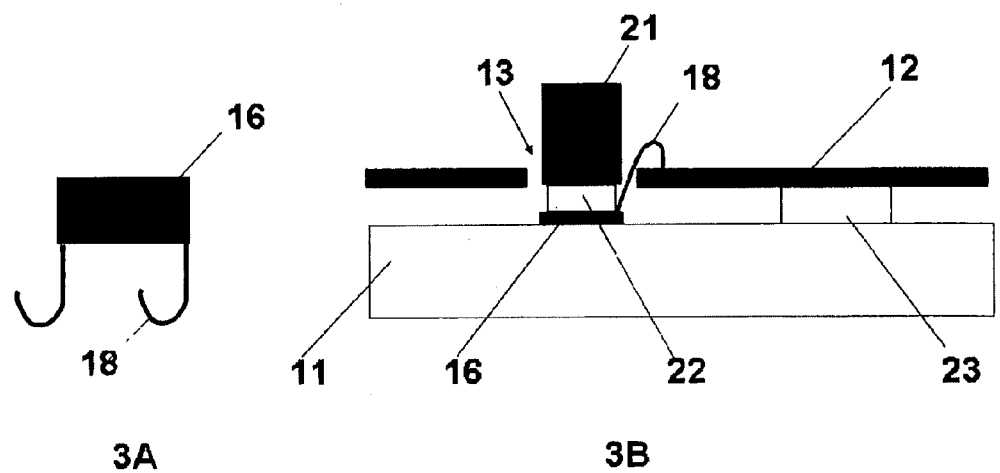
FIG. 3A is a side elevation of a single strain gauge with pigtail connectors according to an exemplary embodiment of the present disclosure.
FIG. 3B is a side elevation of an arrangement of a pressure foot for strain gauges to be mounted on a transducer and the pigtails electrically connected with a printed circuit board, according to an exemplary embodiment of the present disclosure.

FIG. 3 B illustrates how a press foot part 21, 22 puts a well-defined pressure on the strain gauge 16 at gluing towards the transducer body 11, which can be made of steel and/or aluminum, as noted above. The strain gauge 16 is wired to the printed circuit board 12 by a pigtail 18 in such a way that the strain gauge 16 can easily move in all degrees of freedom relative to the printed circuit board 12. The printed circuit board 12 has a clearance 13 above each strain gauge location so that the strain gauge 16 is free for the pressure foot 21. The printed circuit board 12 can be fixed to the transducer 11 by, for example, rubber or plastic parts 23. The pressure foot arrangement 21 may have a rubber part 22 to obtain an even pressure on the strain gauge 16 at gluing. With this arrangement, a stiff printed circuit board can be used, carrying all the needed strain gauges 16 (for example, the twelve strain gauges 16 in FIG. 7) and all the strain gauges 16 can be glued simultaneously.

Furthermore, it is possible to join several modules of transducers 10 by using a flexible printed circuit board 12. Such a flexible printed circuit board 12 allows at first an application of all strain gauges 16 in one plane, and subsequently the transducer 10 modules can be positioned arbitrarily in space, having all relevant connections already installed.

Figure 4:
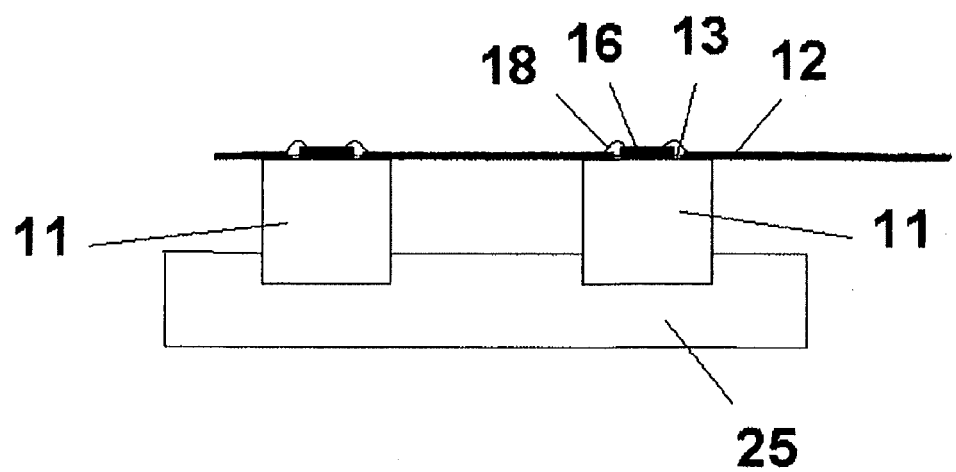
FIG. 4 is a side elevation of an apparatus for clamping transducer elements in order to be laminated with a flexible printed circuit board, according to an exemplary embodiment of the present disclosure.

FIG. 4 illustrates a side elevation of an apparatus 25 for clamping transducer bodies 11 in order to be laminated with a printed circuit board 12, according to an exemplary embodiment of the present disclosure. FIG. 4 shows an arrangement of two transducer 10 modules being clamped in the apparatus 25 for mounting the strain gauges 16 to the transducer body 11 and fixing them at a defined position provided by the respective clearance 13 in the printed circuit board 12. The two modules are joined by the flexible printed circuit board 12, being provided with clearances 13 for the strain gauges 16, which are then mounted automatically and bonded to the conductors 18.

Figure 5:
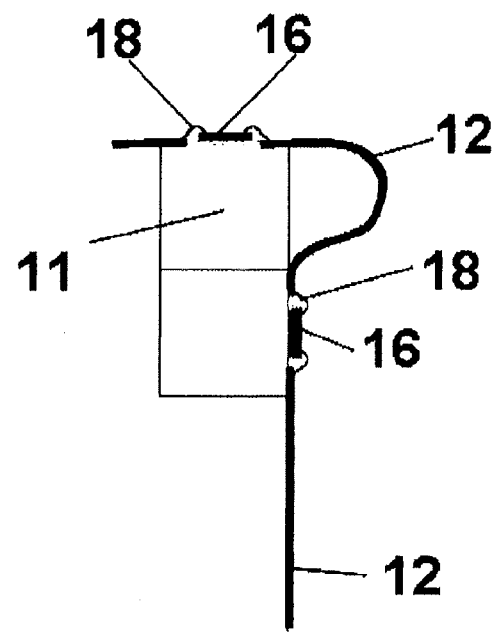
FIG. 5 is a side elevation of the transducers of FIG. 2 in a new position relative to each other showing the flexible printed circuit board connecting the transducer elements, according to an exemplary embodiment of the present disclosure.

FIG. 5 is a side elevation of the transducer modules of FIG. 4 being brought into a new position relative to each other after rotation by 90° to achieve the configuration shown in FIG. 5.

The exemplary illustration in FIG. 5 shows the possibility to achieve an accurate arrangement of strain gauges 16 on two perpendicular surfaces, though the actual mounting process has been performed in one plane.

Hence "composite" transducer modules with strain gauges on several surfaces in space can be produced easily and with high precision and reproducibility. Such "composite" modules allow the measurement of either several load directions on one module, or improve the measurement sensitivity by connecting the various strain gauges in Wheatstone-bridge circuits, for example. For such requirements, the required circuitry may be prefabricated on the printed circuit board 12.

Figure 6:
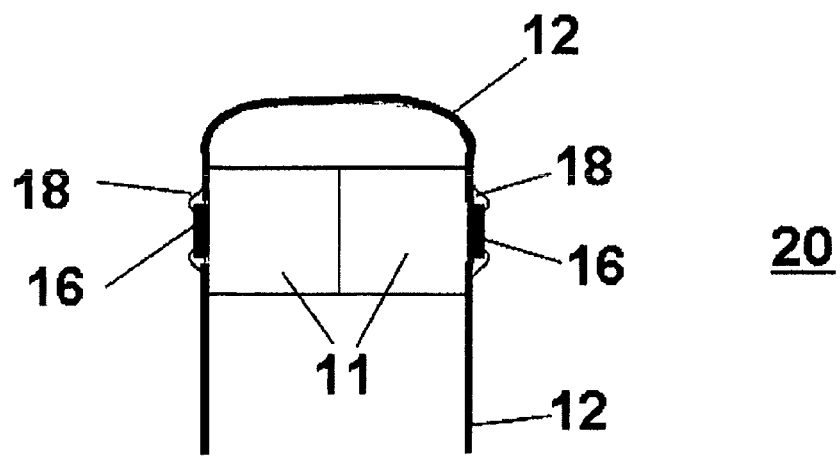
FIG. 6 is a side elevation of the transducers of FIG. 2 in a new position relative to each other showing the flexible printed circuit board connecting the transducer elements, according to an exemplary embodiment of the present disclosure.

FIG. 6 illustrates a side elevation of the transducer bodies 10 of FIG. 4 in a new position relative to each other. For instance, FIG. 6 shows such a composite transducer module with strain gauges 16 on both sides (e.g., opposite sides).

Figure 7:
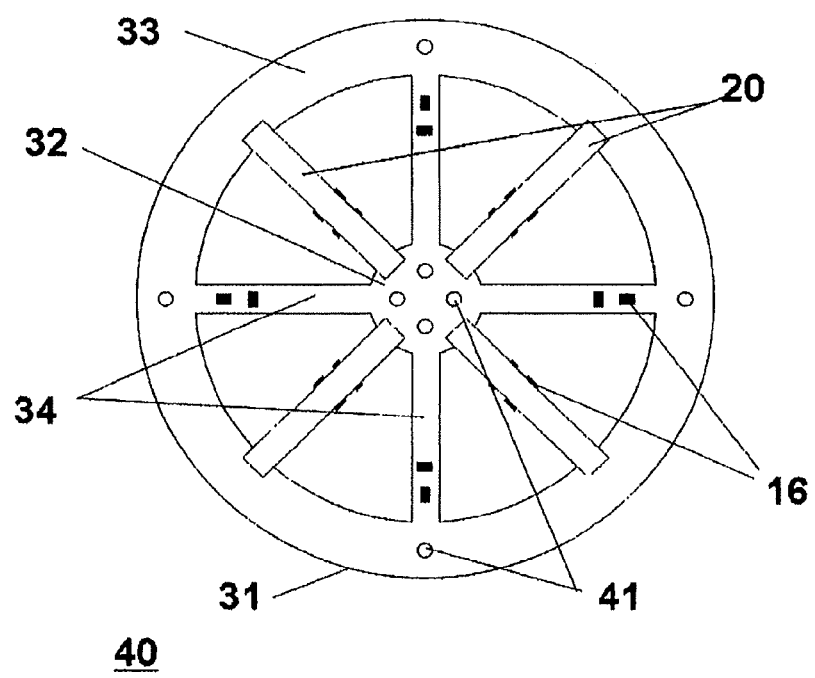
FIG. 7 is a perspective view of a spoke-wheel like modular transducer equipped with assemblies of sensors, according to an exemplary embodiment of the present disclosure.

FIG. 7 shows a perspective view of a force sensor assembly 40 equipped with assemblies of strain gauges 20 which are each arranged on a multiaxial force transducer body 31 made by use of the above-described methods.

In accordance with an exemplary embodiment, the transducer body 31 has the form of a symmetric spoke-wheel with a total of eight spoke-arms, where four first transducer modules 34 are made in one piece commonly with the circular wheel 31, and four second transducer modules 20 are made to be offset by approximately 45° towards the others. The strain gauges 16 are mounted on the first and second transducer modules 34, 20 as described with high precision. For the strain gauge mounting procedure, the transducer modules 20 are not yet mounted in the transducer 31, but are placed separately, rotated by approximately 90° in space to have the strain gauge sides upwards for easy mounting. This allows the use of high precision pick-and-place machines and a simultaneous strain gauge mounting on all surfaces. In known complex transducer structures, for example, on planes perpendicular to the first one, it is not possible to achieve such high precision.

Subsequently, the transducer modules 20, which are prefabricated similarly to FIG. 4 and FIG. 5 and which form the spoke-arms with strain gauges on the sides, are mounted by, for example, welding, pressing, brazing, thermal shrinking or riveting, in the transducer 31 with an offset towards the spokes 34 at an angle of approximately 45°, so that, in this example, the wheel-like transducer module 31 in total has eight spoke-arms 34 and 20.

The strain gauges 16 are fixed on the lateral surfaces of the set of the transducer modules 20 of the transducer body 31, while with the other set of transducer modules 34, the strain gauges 16 are fixed on the top surface, allowing for measurement of forces and torques in all axis directions.

Figure 8:
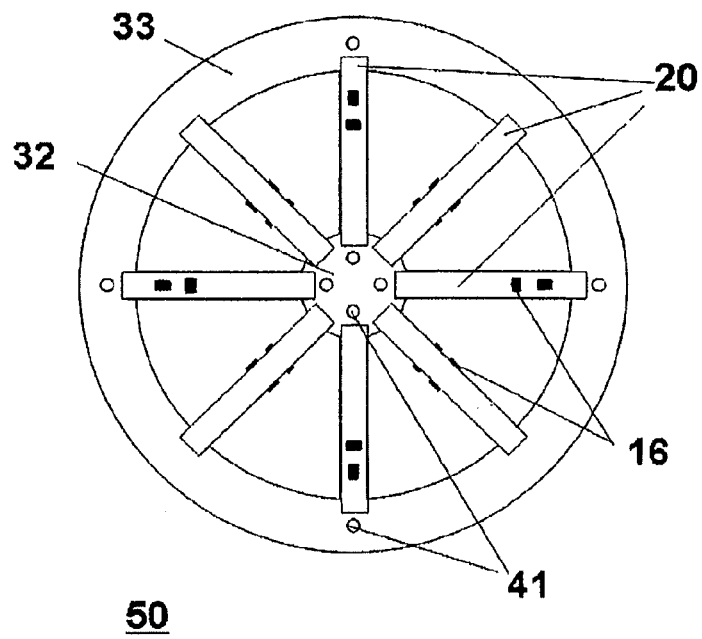
FIG. 8 is a perspective view of a spoke-wheel like modular transducer equipped with assemblies of sensors, according to an exemplary embodiment of the present disclosure.

Alternatively, all transducer modules 20 are mounted in a plane transducer ring structure including two concentric rings 32, 33 as shown in FIG. 8, which exhibits a perspective view of another exemplary embodiment of a spoke-wheel like transducer body equipped with strain gauges.

According to the exemplary configuration shown in FIG. 8, all transducer modules 20 are prefabricated and joined to the concentric rings 32, 33 by, for example, welding, pressing, brazing, thermal shrinking and/or riveting.

Likewise, as shown in FIG. 7, the strain gauges are positioned alternately on the lateral sides of the transducer modules 20 or on the top side in the final mounting position, but they are originally mounted in one work step having all transducer elements positioned with the strain gauge side upwards.

Figure 9:
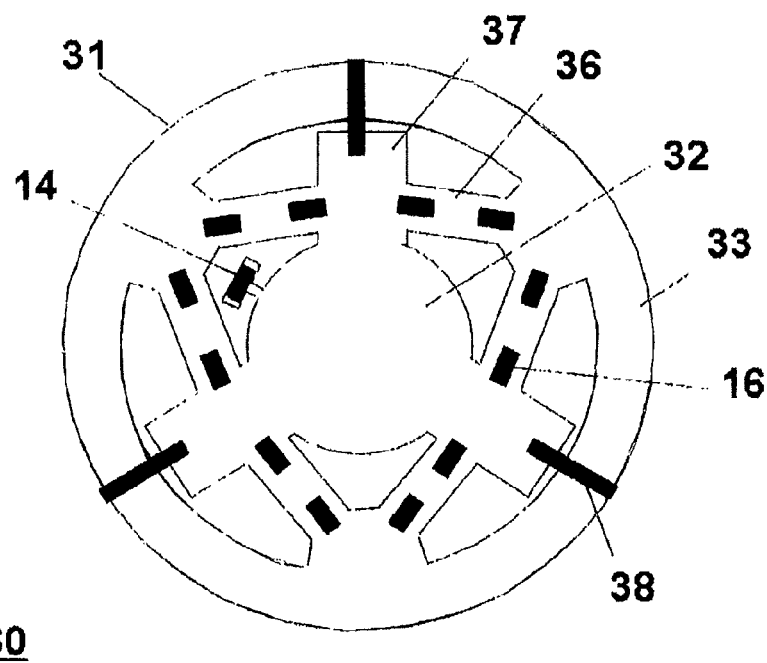
FIG. 9 is a perspective view of an arrangement of a sensor assembly with an outer circular ring and an inner circular disk and secant-like beams and load pieces which are joint by strain gauges, according to an exemplary embodiment of the present disclosure.

FIG. 9 shows an exemplary embodiment of implementing a 6 DOF force/torque sensor assembly 60 based on a structure of a metal (e.g., steel) transducer body. Between the outer ring 33 and the inner ring 32, six beams 36 are arranged in a plane hexapod structure. At the end of each beam 36, there is a strain gauge 16, either a metallic or a piezoresistive gauge, to measure the strains in the beams 36 because of the forces and torques between the outer ring 33 and inner ring 32.

Furthermore, an unloaded strain gauge 14 is provided to compensate for the temperature dependence of the strain gauges 16. In accordance with an exemplary embodiment, overload protection pins 38 may optionally be provided which form a mechanical linkage between the outer ring 33 and a load piece 37.

All the strain gauges 16 can be glued in one plane and this makes it possible to glue all the strain gauges 16 simultaneously, even when the strain gauges 16 are mounted on a printed circuit board with all the electronics for measurement and communication being needed for interfacing to a robot controller, for example.

Figure 10:
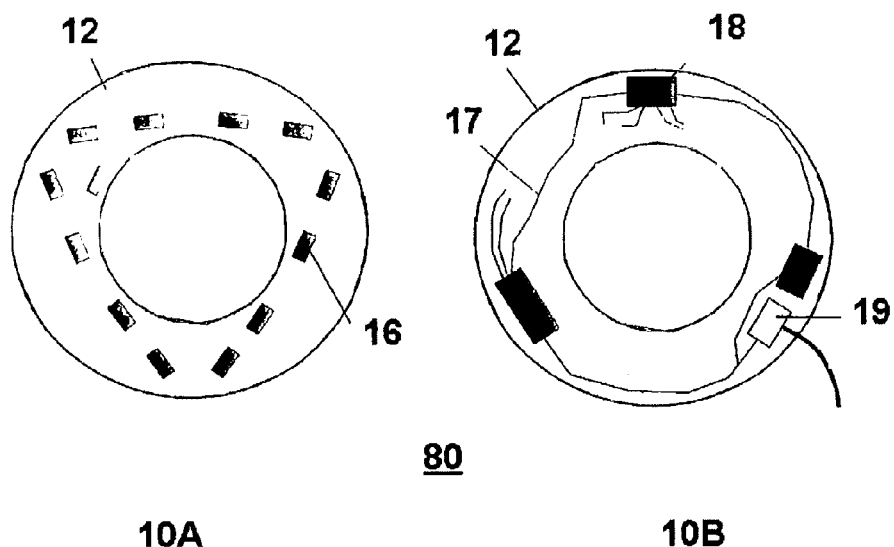
FIG. 10 shows a perspective view on one side (FIG. 10A) of a six DOF force/torque sensor assembly formed as a circular load ring being equipped with several strain gauges at different positions on the load ring which positions form the contour of a triangle, and a perspective view on the back side (FIG. 10B)

FIG. 10 shows a perspective view of a printed circuit board 12 to be mounted directly on the transducer in FIG. 7, in accordance with an exemplary embodiment of the present disclosure. The printed circuit board 12 is equipped with twelve strain gauges 16 to be glued simultaneously on the transducer structure in FIG. 9.

FIG. 10 illustrates the layout of a stiff or flexible printed circuit board 12 with strain gauges 16 on one side (FIG. 10A) and the wiring 17, electrical components 18 and cable contact 19 on the other side (FIG. 10B).

For a complete (e.g., perfect) glue, the printed circuit board 12 is pressed against the transducer (see FIG. 9) with a pressure foot with one contact point above each strain gauge 16 on the printed circuit board 12. In accordance with an exemplary embodiment, the printed circuit board 12 can be flexible to adapt to the differences in the mounting of the strain gauges 16 on the printed circuit board 12.

In accordance with an exemplary embodiment, the electronics and the wiring can be on the same side as the strain gauges 16, whereby the space between the transducer beams 36 (in FIG. 9) can be used for the electronic components. The transducer structure can be made with low precision machining or by die casting, for example, where only the plane in which the transducers are glued needs to have a good finish.

For use in lead through programming or as a 6 DOF input device to a computer, only low forces and torques need to be handled by the transducer, and this can then be made by laser cutting (e.g., water jet guided laser cutting) of a steel sheet. The surface of the steel sheet then may need some polishing before gluing the strain gauges 16 (compare FIG. 9).

Figure 11:
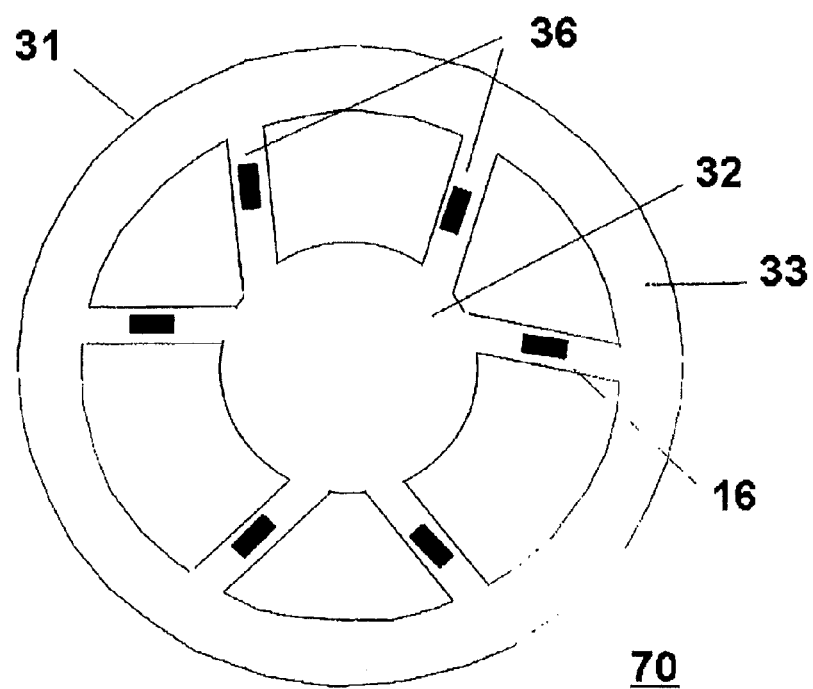
FIG. 11 is a perspective view of an arrangement of a six beam transducer formed by a circular ring and a circular disk being joined by three pairs of roughly radially aligned beams each equipped with a strain gauge.

FIG. 11 is a perspective view of an alternative arrangement in relation to FIG. 9 of a six beam transducer 70 formed by a circular ring 33 and a circular disk 32 joined by three pairs of beams 36 each equipped with a strain gauge 16. As in FIG. 7, the beams 36 are arranged in a hexapod structure, but in contrast to FIG. 7, each pair of beams 36 meets at the inner part 32 of the transducer instead of at the outer part 33, as in FIG. 9.

FIG. 11 shows that the six beam transducer 60 or 70 can, of course, be arranged in different ways but in order to make it possible to obtain a 6 DOF force/torque sensor with strain gauges mounted in a plane, the beams follow a lane hexapod pattern that makes it possible to distinguish between 3 torque and 3 force components. In the example of FIG. 11, only six strain gauges 16 are used, which is possible when the requirements on accuracy and dynamic range of the sensor is not critical.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCES 10. transducer assembly with pcb and strain gauges
11. transducer body
12. printed circuit board (pcb)
13. clearance for strain gauge
14. compensation strain gauge
15. strain gauge mounted on side surface of transducer body (difficult access)
16. strain gauge mounted on top surface of transducer body (easy access)
17. electrical conductor on pcb
18. pigtail connector for strain gauge
19. cable connector
20. assembly of several transducers in space with strain gauges on different outer surfaces
21. press foot
22. pad
23. spacer, support for pcb on transducer body
25. apparatus, transducer mounting tool
30. conventional monolithic transducer assembly
31. monolithic base transducer element (consists of 32, 33, 34 or 36)
32. inner load introduction disc/ring
33. outer load introduction ring
34. integral radial spokes of 31
36. beam elements of transducer (arbitrary orientation)
37. load element for overload protection
38. load pin for overload protection
39. clearance for overload pin 38
40. modular transducer assembly
41. mounting holes
50. modular transducer assembly
60. transducer with hexapod structure and pcb-based strain gauge assembly (including 80)
70. transducer with alternative hexapod structure
80. pcb with integrated strain gauges and electronic components as used in 60

What is claimed is:

1. A multiaxial force/torque sensor assembly comprising:
a printed circuit board;
a transducer body in mechanical contact with the printed circuit board; and
a set of at least two sensors each being made of strain gauges, which are each arranged at a definite angle and distance relative to each other and which are each fixed to the transducer body,
wherein the printed circuit board includes clearances for each strain gauge, respectively, and associated electronic components and wiring located on a remaining area of the printed circuit board for monitoring compressive and tensile stresses in measurement directions of the sensors,
wherein the transducer body has at least one of (i) a ring structure which includes a first concentric ring being joined to one of a disk and a second concentric ring by at least three beams, and (ii) a spoke wheel structure having spoke-arms.

2. The sensor assembly according to claim 1, wherein a position and alignment of the clearances in the printed circuit board correspond to a planned position and alignment of the strain gauges.

3. The sensor assembly according to claim 1, wherein the strain gauges are joined to the printed circuit board by bonding.

4. The sensor assembly according to claim 1, wherein at least one of the strain gauges is a semiconductor strain gauge.

5. The sensor assembly according to claim 1, comprising:
acceleration sensors applied to the printed circuit board.

6. The sensor assembly according to claim 1, wherein the printed circuit board is made of a flexible material.

7. A six degree of freedom force/torque sensor comprising:
a combination of at least six of the sensors of the sensor assembly of claim 1,
wherein the six sensors are arranged at different angles with respect to each other.

8. The sensor assembly according to claim 1, wherein the strain gauges are arranged in a Wheatstone Circuit which is prefabricated on the printed circuit board.

9. The sensor assembly according to claim 1, wherein the ring structure of the transducer body includes the first and second concentric rings and the at least three beams being arranged in a plane hexapod structure, and
wherein the sensors are fixed to each of the beams and in a common plane.

10. The sensor assembly according to claim 1,
wherein the sensors are fixed to the spoke wheel and to the spoke-arms.

11. The sensor assembly according to claim 1, wherein each of the strain gauges are aligned in a common plane.

12. The sensor assembly according to claim 1, wherein the sensor assembly is configured for controlling robots.

13. The sensor assembly according to claim 1, wherein the printed circuit board is made of a flexible material, and
wherein the strain gauges are joined to the flexible printed circuit board, which is configured to be bent arbitrarily in space.

14. The sensor assembly according to claim 1, comprising:
a coating for protecting the strain gauges and the electrical components arranged on the printed circuit board.

15. A method for assembling a multiaxial force/torque sensor assembly, wherein the sensor assembly includes:
a printed circuit board;
a transducer body in mechanical contact with the printed circuit board; and
a set of at least two sensors each being made of strain gauges, which are each arranged at a definite angle and distance relative to each other and which are each fixed to the transducer body,
wherein the printed circuit board includes clearances for each strain gauge, respectively, and associated electronic components and wiring located on a remaining area of the printed circuit board for monitoring compressive and tensile stresses in measurement directions of the sensors,
wherein the transducer body has at least one of (i) a ring structure which includes a first concentric ring being joined to one of a disk and a second concentric ring by at least three beams, and (ii) a spoke wheel structure having spoke-arms, and
wherein the method comprises the steps of:
arranging each of the strain gauges on a plane measurement surface of a transducer body in a definite arrangement so that each of the strain gauges are arranged at a definite angle and distance relative to each other;
fixing each of the strain gauges to the transducer body via adhesives; and
connecting the gauges to respective conductors by electrical bonding.

16. The method for assembling a multiaxial force/torque sensor assembly according to claim 15, comprising the steps of:
mechanically connecting the transducer body to a printed circuit board such that the printed circuit board is arranged in a predetermined position and orientation on the transducer body;
positioning the strain gauges on the printed circuit board;
connecting the strain gauges; and
fixing the strain gauges to the printed circuit board.

17. The method for assembling a multiaxial force/torque sensor assembly according to at least claim 15, comprising the steps of:
providing a monolithic transducer structure in which all surfaces for strain gauge application are positioned in one plane;
applying a prefabricated printed circuit board to the transducer body;
positioning and bonding the strain gauges and electrical components on a measurement surface of the transducer body in clearances of the printed circuit board, and electrically connecting the strain gauges to the electrical components via wiring.

18. The method for assembling a sensor assembly according to claim 16, wherein the printed circuit board includes clearances for receiving the strain gauges, and is laminated to the transducer body.

19. The method for assembling a sensor assembly according to claim 16, comprising:
positioning the strain gauges on the printed circuit board by a pick-and-place machine.

20. The method for assembling a sensor assembly according to claim 16, wherein electrical contacts of the strain gauges are received in the printed circuit board.

21. The method for assembling a sensor assembly according to claim 20, wherein the electrical contacts of the strain gauges are made by wire bonding.

22. The method for assembling a sensor assembly according to claim 18, comprising:
applying a flexible printed circuit board to more than one transducer body;
applying all strain gauges in one plane;
positioning the transducer bodies, subsequent to the application of all strain gauges in the one plane, arbitrarily in space having all relevant connections already installed; and
bending the flexible printed circuit board to follow a course of different planes.

23. The method for assembling a sensor assembly according to claim 16, comprising:
mounting all other electric and/or electronic components while positioning and bonding the strain gauges.

24. The method for assembling a sensor assembly according to claim 16, wherein the position of any strain gauge to be inserted is marked precisely.

25. The method for assembling a sensor assembly according to claim 24, wherein the marking of any position for strain gauges to be inserted is performed by laser marking generating marks on at least one of the transducer body and the printed circuit boards.

26. The method for assembling a sensor assembly according to claim 25, comprising:
recognizing any laser mark by operation of a pick-and-place machine.

27. The sensor assembly according to claim 1, wherein the transducer body is metal.

28. The sensor assembly according to claim 1, wherein the transducer body is in direct mechanical contact with the printed circuit board.

29. The sensor assembly according to claim 1, wherein the transducer body is in indirect mechanical contact with the printed circuit board.

30. The sensor assembly according to claim 9, wherein the ring structure of the transducer body includes six beams.

31. The sensor assembly according to claim 30,
wherein the sensors are fixed to the spoke wheel and to the spoke-arms.

32. The sensor assembly according to claim 9,
wherein the sensors are fixed to the spoke wheel and to the spoke-arms.

33. The sensor assembly according to claim 1, wherein the strain gauges are aligned in up to four planes.

34. The method for assembling a multiaxial force/torque sensor assembly according to at least claim 15, comprising the steps of:
providing a modular transducer structure in which all surfaces for strain gauge application are positioned in one plane;
applying a prefabricated printed circuit board to the transducer body;
positioning and bonding the strain gauges and electrical components on a measurement surface of the transducer body in clearances of the printed circuit board, and electrically connecting the strain gauges to the electrical components via wiring; and
arranging and fixing the transducer parts in space to achieve multi-axis measurement capability.

35. The method for assembling a sensor assembly according to claim 34, wherein the strain gauges are positioned in the clearances of the printed circuit board, and the printed circuit board is laminated to the transducer body.

36. The method for assembling a sensor assembly according to claim 17, wherein the strain gauges are positioned in the clearances of the printed circuit board, and the printed circuit board is laminated to the transducer body.

37. The method for assembling a sensor assembly according to claim 17, comprising:
positioning the strain gauges on at least one of the transducer body and the printed circuit board by a pick-and-place machine.

38. The method for assembling a sensor assembly according to claim 17, comprising:
mounting all other electric and/or electronic components while positioning and bonding the strain gauges.

39. The method for assembling a sensor assembly according to claim 17, wherein the position of any strain gauge to be inserted is marked precisely.

40. The method for assembling a sensor assembly according to claim 39, wherein the marking of any position for strain gauges to be inserted is performed by laser marking generating marks on at least one of the transducer body and the printed circuit boards.

* * * * *